US008761406B2

(12) United States Patent
Ohkuri et al.

(10) Patent No.: US 8,761,406 B2
(45) Date of Patent: Jun. 24, 2014

(54) AUDIO SIGNAL PROCESSING DEVICE AND AUDIO SIGNAL PROCESSING METHOD

(75) Inventors: Kazunobu Ohkuri, Kanagawa (JP); Kohei Asada, Kanagawa (JP); Shiro Suzuki, Kanagawa (JP); Tetsunori Itabashi, Kanagawa (JP); Hiroki Kawanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 459 days.

(21) Appl. No.: 12/485,191

(22) Filed: Jun. 16, 2009

(65) Prior Publication Data

US 2009/0310793 A1 Dec. 17, 2009

(30) Foreign Application Priority Data

Jun. 16, 2008 (JP) ................................. 2008-156190

(51) Int. Cl.
*H03G 3/20* (2006.01)
*H03G 5/00* (2006.01)
*H03G 9/00* (2006.01)
*H03G 7/00* (2006.01)
*H03B 29/00* (2006.01)
*G10K 11/16* (2006.01)

(52) U.S. Cl.
USPC ............. 381/57; 381/98; 381/102; 381/106; 381/71.1; 381/71.6

(58) Field of Classification Search
USPC ............. 381/74, 71.1, 74.2, 71.6, 71.8, 57, 381/71.14, 98, 101, 102, 104, 106, 107
See application file for complete search history.

(56) References Cited

U.S. PATENT DOCUMENTS

| 5,260,920 | A | 11/1993 | Ide et al. |
| 5,276,740 | A | 1/1994 | Inanaga et al. |
| 5,500,900 | A | 3/1996 | Chen et al. |
| 5,511,129 | A | 4/1996 | Craven et al. |
| 8,076,567 | B2 * | 12/2011 | Suzuki et al. ............ 84/616 |
| 2003/0198357 | A1 * | 10/2003 | Schneider et al. ....... 381/94.2 |

(Continued)

FOREIGN PATENT DOCUMENTS

| EP | 1378912 A2 | 1/2004 |
| JP | 03-096199 | 4/1991 |

(Continued)

OTHER PUBLICATIONS

Peltonen et al., "Computational Auditory Scene Recognition", 2002 IEEE International Conference on Acoustics, Speech, and Signal Processing Proceedings. (ICASSP). Orlando, FL, May 13-17, 2002; IEEE International Conference on Acoustics, Speech, and Signal Processing (ICASSP), May 13, 2002, p. II-1941, vol. 2, New York, NY.

(Continued)

*Primary Examiner* — Vivian Chin
*Assistant Examiner* — David Ton
(74) *Attorney, Agent, or Firm* — Wolf, Greenfield & Sacks, P.C.

(57) ABSTRACT

An audio signal processing device includes: a microphone configured to collect noise; an analyzing unit configured to analyze an audio signal collected by the microphone to detect the level and frequency property of the collected audio signal; and a signal processing unit configured to subject an audio signal to be reproduced to signal processing based on the analysis results of the analyzing unit.

26 Claims, 11 Drawing Sheets

(56) References Cited

U.S. PATENT DOCUMENTS

| | | | |
|---|---|---|---|
| 2004/0003706 A1* | 1/2004 | Tagawa et al. | 84/609 |
| 2004/0244568 A1 | 12/2004 | Nakabo et al. | |
| 2006/0204025 A1* | 9/2006 | Paludan-Muller et al. | 381/317 |
| 2006/0262938 A1* | 11/2006 | Gauger et al. | 381/56 |
| 2007/0025560 A1 | 2/2007 | Asada | |
| 2007/0053528 A1 | 3/2007 | Kim et al. | |
| 2007/0223733 A1* | 9/2007 | Shuttleworth et al. | 381/94.1 |
| 2008/0123285 A1* | 5/2008 | Fadell et al. | 361/686 |

FOREIGN PATENT DOCUMENTS

| | | |
|---|---|---|
| JP | 03-214892 | 9/1991 |
| JP | 04-051700 A | 2/1992 |
| JP | 08-116587 A | 5/1996 |
| JP | 2002-152897 A | 5/2002 |
| JP | 2002-186100 A | 6/2002 |
| JP | 2002-218599 A | 8/2002 |
| JP | 2005-341534 A | 12/2005 |
| JP | 2006-101441 A | 4/2006 |
| JP | 2006-295669 A | 10/2006 |
| JP | 2008-005269 A | 1/2008 |
| JP | 2008-099163 A | 4/2008 |
| JP | 2008-122729 A | 5/2008 |
| JP | 2008-124564 A | 5/2008 |
| WO | WO 2006/125061 A1 | 11/2006 |
| WO | WO 2007/113487 A1 | 10/2007 |

OTHER PUBLICATIONS

The active control around the head based on Kirchhoff's integral equation.

* cited by examiner

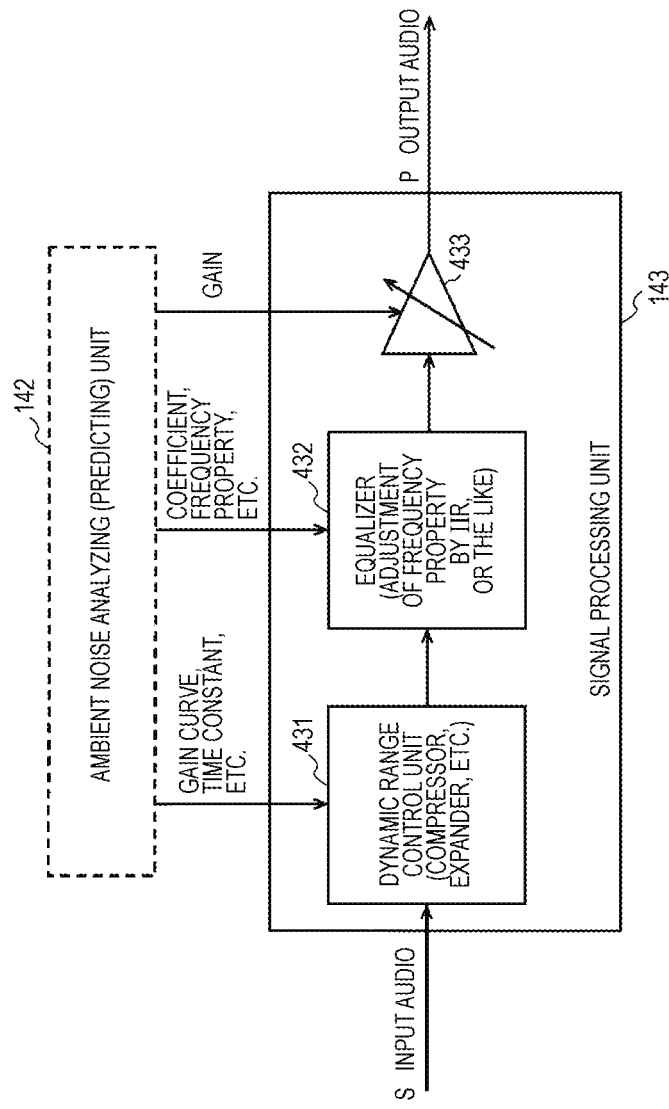

FIG. 4

| AMBIENT NOISE FEATURES | SIGNAL PROCESSING CONTENT |
|---|---|
| AMBIENT NOISE LEVEL IS GREAT | 1. INCREASE THE GAIN OF INPUT AUDIO SIGNAL. |
|  | 2. INCREASE THE AMOUNT OF COMPRESSOR AS TO INPUT AUDIO SIGNAL. |
| NOISE IN THE VICINITY OF PARTICULAR FREQUENCY IS GREATLY INCLUDED IN AMBIENT NOISE | BOOST A SIGNAL IN THE VICINITY OF THE PARTICULAR FREQUENCY OF INPUT AUDIO SIGNAL. |
| THE NOISE COMPONENT OF PARTICULAR FREQUENCY BAND IS VERY GREAT | CUT THE SIGNAL OF THE FREQUENCY BAND OF INPUT AUDIO SIGNAL, AND BOOST THE SIGNAL OF ANOTHER FREQUENCY BAND. |
| ... | ... |

FIG. 6

| NOISE CATEGORY | NOISE LEVEL | NC FILTER PROPERTY | SIGNAL PROCESSING CONTENT |
|---|---|---|---|
| INSIDE OF AN AIRPLANE · NOISE CONCENTRATES ON LOW FREQUENCIES | SMALL | 1 | INCREASE THE SIGNAL GAIN OF A NOISE BAND (LOW FREQUENCIES). APPLY WEAK COMPRESSOR THERETO. |
| | MEDIUM | 2 | INCREASE THE SIGNAL GAIN OF A NOISE BAND (LOW FREQUENCIES). APPLY MIDDLE COMPRESSOR THERETO. |
| | LARGE | 3 | CUT LOW FRQUENCIES, AND INCREASE THE GAIN OF HIGH FREQUENCIES. APPLY STRONG COMPRESSOR THERETO. |
| INSIDE OF A TRAIN · NOISE CONCENTRATES ON MIDDLE FREQUENCIES | SMALL | 4 | INCREASE THE SIGNAL GAIN OF A NOISE BAND (MIDDLE FREQUENCIES). |
| | MEDIUM | 5 | INCREASE THE SIGNAL GAIN OF A NOISE BAND (MIDDLE FREQUENCIES). APPLY WEAK COMPRESSOR THERETO. |
| | LARGE | 6 | APPLY MIDDLE COMPRESSOR THERETO. EMPHASIZE BEAT. |
| CROWD, ETC. · NOISE INCREASES ACROSS WIDEBAND | SMALL | 7 | ... |
| | MEDIUM | 8 | ... |
| | LARGE | 9 | ... |
| INSIDE OF AN OFFICE · NOISE OF PARTICULAR BAND OCCURS DISCRETELY | SMALL | 10 | ... |
| | MEDIUM | 11 | ... |
| | LARGE | 12 | ... |
| INDOORS ... | ... | ... | ... |

FIG. 9

| NOISE CATEGORY | SELECTION CONDITIONS ||||| 
|---|---|---|---|---|---|
| | GENRE | TEMPO | TONALITY | MEAN LEVEL | BEAT FEELING |
| INSIDE OF AN AIRPLANE<br>• NOISE CONCENTRATES ON LOW FREQUENCIES | POP | QUICK | MAJOR KEY | — | STRONG |
| INSIDE OF A TRAIN<br>• NOISE CONCENTRATES ON MIDDLE FREQUENCIES | POP | SLOW | MINOR KEY | — | SOFT |
| CROWD, ETC.<br>• NOISE INCREASES ACROSS WIDEBAND | ROCK | — | — | HIGH | STRONG |
| INDOORS, ETC.<br>• LITTLE NOISE ACROSS THE ENTIRE BAND | CLASSIC | — | — | — | — |
| ... | ... | ... | ... | ... | ... |

AUDIO SIGNAL PROCESSING DEVICE AND AUDIO SIGNAL PROCESSING METHOD

BACKGROUND OF THE INVENTION

1. Field of the Invention

The present invention relates to a device and method whereby a more comfortably listenable audio signal can be reproduced by an audio signal being subjected to processing with, for example, a noise canceling system or the like.

2. Description of the Related Art

Hitherto, there has been an active noise canceling system included in headphones. The noise canceling systems currently in practical use are generally classified into two methods of a feedback method and a feed-forward method.

For example, Japanese Unexamined Patent Application Publication No. 3-214892 discloses an arrangement wherein noise within an acoustic tube 1, collected at a microphone unit 6 provided within the acoustic tube 1 mounted in the ear of a user, is subjected to phase inversion to emit sound from an earphone unit 3 provided in the vicinity of the microphone unit 6, thereby reducing external noise.

Also, Japanese Unexamined Patent Application Publication No. 3-96199 discloses an arrangement relating to noise reduction headphones wherein the output of a second microphone 3 disposed between headphones 1 and the ear canal of a user is employed at the time of mounting to identify the transfer characteristic from a first microphone 2 to the headphones 1 which collect external noise provided in the vicinity of the ear at the time of mounting with the transfer characteristic until external noise reaches the ear canal, whereby external noise can be reduced regardless of the method of wearing the headphones.

In the cases of the above-mentioned techniques disclosed in Japanese Unexamined Patent Application Publication Nos. 3-214892 and 3-96199, ambient noise is reduced, thereby adjusting a listening environment wherein audio signal to be reproduced is suitable.

SUMMARY OF THE INVENTION

Now, in recent years, portable music playing devices have become widespread, whereby music can be reproduced and listened to at various places, for example, such as inside of a train, inside of an airplane, in a crowd, inside of a room, and so forth. Therefore, with a noise canceling system, various types of ambient noise which occurs at various places where music is reproduced has to be reduced effectively. Accordingly, there has to be considered various types of measures other than depending on a noise canceling system alone, and reducing ambient noise itself with a noise canceling system, so that user can listen to reproduced audio comfortably.

It has been found desirable to employ measures other than measures for reducing ambient noise itself, whereby reproduced sound can be listened to comfortably even under a situation where ambient noise occurs.

An audio signal processing device according to an embodiment of the present invention includes: a microphone configured to collect noise; an analyzing unit configured to analyze an audio signal collected by the microphone to detect the level and frequency property of the collected audio signal; and a signal processing unit configured to subject an audio signal to be reproduced to signal processing based on the analysis results of the analyzing unit.

With the above configuration, the audio signal collected at the microphone is analyzed at the analyzing unit, the occurrence frequency band of ambient noise, and the level of ambient noise are detected, and are supplied to the signal processing unit. With the signal processing unit, an audio signal to be reproduced is subjected to signal processing for reducing the influence of ambient noise based on the results of the analyzing unit.

Thus, an audio signal to be reproduced is subjected to signal processing according to ambient noise, and accordingly, even in a case where ambient noise occurs, an audio signal to be reproduced is reproduced in a suitable manner, whereby the user can listen to this comfortably.

The audio signal processing device may further include: a noise cancel signal forming unit configured to form a noise cancel signal from the audio signal collected by the microphone; and an adding unit configured to add the noise cancel signal from the noise cancel signal forming unit to an output signal from the signal processing unit, with the signal processing unit subjecting the audio signal to be reproduced to signal processing while taking the property of the noise cancel signal forming unit into consideration.

With the above configuration, a noise cancel signal is formed from the audio signal collected at the microphone by the noise cancel signal forming unit. This noise cancel signal is added to the audio signal output from the signal processing unit by the adding unit, thereby performing noise cancel processing (noise reduction processing). Thus, noise cancel processing can also be performed, so even in a case where ambient noise occurs, the user can listen to reproduced sound more comfortably.

The signal processing unit may perform one or more of dynamic range control, frequency property control, and gain control.

The signal processing unit may perform one or more processes of a dynamic range control process by a so-called compressor, expander, or the like, a frequency property control process such as emphasis, reduction, or the like of a target frequency property, and a gain control process. Thus, after an audio signal to be reproduced is subjected to suitable signal processing, the audio signal is reproduced, so even in a case where ambient noise occurs, the user can comfortably listen to the reproduced sound.

The audio signal processing device may further include: a storage unit configured to store one or more audio signals to be reproduced to which metadata, including genre, tempo, tonality, mean level, and beat, is added; a selecting unit configured to select an audio signal to be reproduced based on the analysis results from the analyzing unit, and the metadata of an audio signal stored in the storage unit; and a playing processing unit configured to read out the audio signal selected by the selecting unit from the storage unit to form an audio signal to be supplied to the signal processing unit from the read audio signal.

With the above configuration, an audio signal to be reproduced is appended with various types of metadata such as a genre, tempo, and so forth, and is held in a recording medium. Subsequently, an audio signal to be reproduced is selected by the selecting unit from the audio signals held in the recording medium, based on analyzing results from the analyzing unit. This selected audio signal is read out and processed by the playing processing unit, and is supplied to the signal processing unit.

Thus, an audio signal suitable for reproduction can be selected and reproduced according to ambient noise. For example, in a case where ambient noise is severe, a rock piece audio signal of which the mean level (the mean value of the sound of the entire tune, represented in units such as decibels (dB) or the like) is high overall can be reproduced, and in a case where ambient noise is low, an audio signal with the low mean value and slow tempo can be reproduced. Accordingly, a suitable audio signal can be selected and reproduced automatically according to a situation of ambient noise, so even under a situation where ambient noise occurs, the user can comfortably listen to reproduced sound.

According to the above configurations, measures other than measures for reducing ambient noise itself are employed, so the user can comfortably listen to reproduced sound even under a situation where ambient noise occurs.

BRIEF DESCRIPTION OF THE DRAWINGS

FIG. 3 is a block diagram for describing a configuration example of a signal processing unit;

FIG. 4 is a diagram for describing a configuration example of a table for correlating the features of ambient noise with signal processing parameters;

FIG. 6 is a diagram for describing a configuration example a table (signal processing content determining table) for correlating a noise category with signal processing parameters;

FIG. 9 is a diagram for describing an example of a selection condition table for selecting an audio signal to be reproduced;

DESCRIPTION OF THE PREFERRED EMBODIMENTS

An embodiment of a device, method, and program according to the present invention will be described with reference to the drawings. With embodiments described below, description will be made regarding a case where the present invention has been applied to a noise canceling system employing headphones as an example. Also, the device, method, and program according to the present invention can take various types of audio signal as a processing target, but in the following, in order to simplify description, let us say that audio signals are music data for playing music unless otherwise noted.

First Embodiment

Configuration of Noise Canceling System 1

Figure 1:
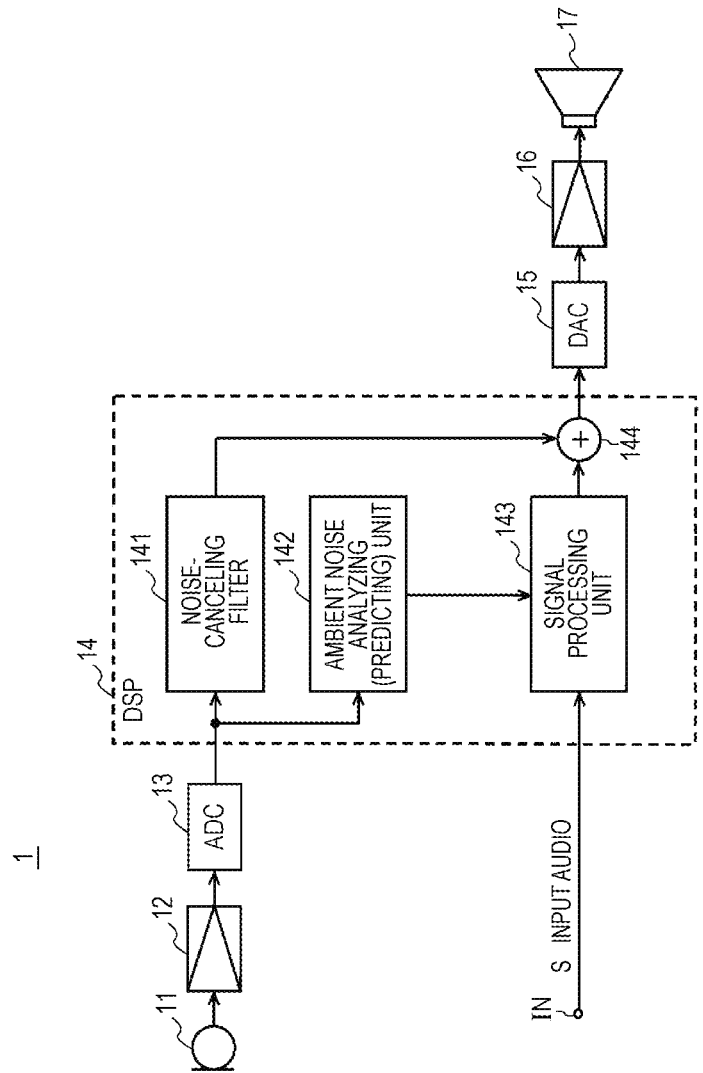
FIG. 1 is a block diagram for describing a noise canceling system 1 to which an embodiment of the present invention has been applied.

FIG. 1 is a block diagram for describing a noise canceling system 1 according to a first embodiment. As shown in FIG. 1, the noise canceling system 1 includes, as a sound collection system of ambient noise, a microphone 11 for noise collection, microphone amplifier 12, and ADC (Analog-Digital Converter) 13.

Also, the noise canceling system 1 includes a DSP (Digital Signal Processor) 14 for performing various types of signal processing. Further, the noise canceling system 1 includes an input terminal IN for an audio signal as an input system, and includes a DAC (Digital-Analog Converter) 15, speaker amplifier 16, and speaker 17 as an output system.

Note that, with the noise canceling system 1, the DSP 14 realizes, as shown in FIG. 1, the functions of a noise cancel filter 141, ambient noise analyzing (predicting) unit 142, signal processing unit 143, and adding unit 144.

In FIG. 1, the microphone 11 for noise collection, and speaker 17 are disposed separately. However, in reality, these are provided in the vicinity of the headphone casing (housing portion). That is to say, of the noise canceling system which is realized by employing headphones, there are the feedback method, and the feed-forward method, and in either case, the microphone for noise collection is provided in the housing portion of the headphones.

Figure 2A:
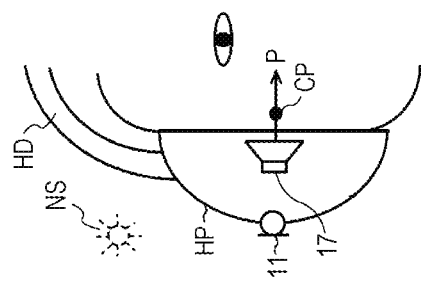
FIGS. 2A and 2B are diagrams for describing the overview of a feedback noise canceling system, and the overview of a feed-forward noise canceling system.
Figure 2B:
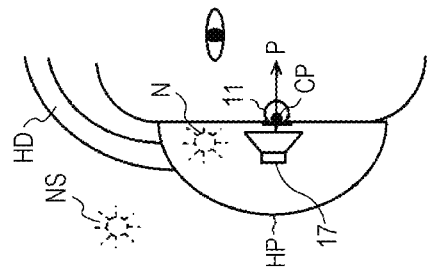

FIGS. 2A and 2B are diagrams for describing the overview of a feedback noise canceling system, and the overview of a feed-forward noise canceling system. FIG. 2A illustrates the configuration of the right-channel side in a case where a headphone system to which the feedback noise canceling system has been applied is mounted on a user head (user (listener)'s head portion) HD.

With the feedback method, in general, as shown in FIG. 2A, a microphone 11 is provided in the inner side of the housing portion HP. The reverse phased component (noise cancel signal) of a signal (noise signal) collected at the microphone 11 is then fed back to the signal system to perform servo control, thereby attenuating the noise entering the headphone casing HP externally.

In this case, the position of the microphone 11 becomes a cancel point (control point) CP which is equivalent to the ear position of the listener, so taking noise damping effects into consideration, the microphone 11 is frequently disposed in the position close to the ear of the listener, i.e., in front of the vibrating plate of the speaker 17.

FIG. 2B illustrates the configuration of the right-channel side in a case where a headphone system to which the feed-forward noise canceling system has been applied is mounted on a user head (user (listener)'s head portion) HD. The feed-forward method is a method wherein the microphone 11 is basically disposed in the outside of the housing portion HP as shown in FIG. 2B. With feed-forward, the noise collected at the microphone 11 is subjected to appropriate filtering processing, and is reproduced at the speaker 17 within the housing portion HP, and this noise is canceled at a portion close to the ear.

Thus, with the noise canceling system 1 according to the first embodiment, the microphone 11 for noise collection, and speaker 17 are both provided in the housing portion HP of the headphones. Note that the noise canceling system 1 according to the present embodiment can be employed in both of the feedback noise canceling system and the feed-forward noise canceling system.

In the case of the noise canceling system 1 shown in FIG. 1, an analog audio signal collected through the microphone 11 for noise collection, and converted into an electric signal is amplified up to a suitable level at the microphone amplifier 12, and is then supplied to the ADC 13.

The ADC 13 subjects the supplied analog audio signal to analog/digital conversion to form a digital audio signal, and supplies this to the noise cancel filter 141 and ambient noise analyzing (predicting) unit 142 of the DSP 14.

The noise cancel filter 141 is principally made up of an inverter for generating a noise cancel signal which is the reverse phased signal of collected and obtained ambient noise, and a filter for adjusting the cancel band. The noise cancel filter 141 generates a noise cancel signal based on the digital audio signal (ambient noise signal) from the ADC 13, and supplies this to the adding unit 144.

On the other hand, the ambient noise analyzing (predicting) unit 142 analyzes the digital audio signal (ambient noise signal) from the ACD 13 to detect various types of information relating to the level of the ambient noise signal, and the frequency property of the ambient noise. That is to say, the ambient noise analyzing (predicting) unit 142 detects what level of noise has occurred in which frequency band now, and supplies this to the signal processing unit 143.

Note that, in the case of the feedback noise canceling system, the analysis results at the ambient noise analyzing (predicting) unit 142 become information equivalent to the prediction results regarding ambient noise. Therefore, in order to clarify the function of the ambient noise analyzing (predicting) unit 142, the term "prediction" is included.

For example, an audio signal (digital audio signal) from a music playing device is supplied to the signal processing unit 143 through the input terminal IN for audio signals to be reproduced. Subsequently, the signal processing unit 143 subjects the audio signal to be reproduced supplied through the input terminal IN to signal processing for controlling frequency property, gain, or the like based on the analysis results from the ambient noise analyzing (predicting) unit 142.

The frequency property and gain controlled at the signal processing unit 143 are selected such that the listener of reproduced sound can appreciate the music thereof optimally under a current noise environment. Note that the details of the configuration and operation of the signal processing unit 143 will be described later.

The audio signal to be processed at the signal processing unit 143 is supplied to the adding unit 144. The noise cancel signal from the noise cancel filter 141 is supplied to the adding unit 144 as described above. Thus, the noise cancel signal from the noise cancel filter 141 is added to the audio signal to be reproduced from the signal processing unit 143, and noise reduction processing is also executed.

Subsequently, the audio signal output from the adding unit 144 is supplied to the DAC 15. The DAC 15 converts the supplied audio signal into an analog audio signal for reproduction, and then supplies this to the speaker amplifier 16. The speaker amplifier 16 amplifies the supplied analog audio signal, and supplies this to the speaker 17.

Thus, audio corresponding to the audio signal to be reproduced, which has been subjected to signal processing according to ambient noise and ambient noise has been canceled, is emitted from the speaker 17. That is to say, reproduced audio corresponding to an audio signal is emitted such that the user can listen to the audio signal comfortably. Accordingly, a comfortable listening environment of reproduced audio can be adjusted.

Configuration Example and Operation of Signal Processing Unit 143

FIG. 3 is a block diagram for describing a configuration example of the signal processing unit 143 shown in FIG. 1. As shown in FIG. 3, the signal processing unit 143 includes a dynamic range control unit 431, equalizer 432, and variable gain control unit 433.

The dynamic range control unit 431 accepts an instruction such as a gain curve, time constant, or the like to control the dynamic range of an audio signal to be reproduced. Also, the equalizer 432 accepts instruction information of a coefficient or frequency property to control the frequency property of an audio signal to be reproduced. Also, the variable gain control unit 433 controls the gain of an audio signal to be reproduced.

For example, in a case where ambient noise level is great across the entire band, the signal processing unit 143 controls the variable gain control unit 433 based on the analysis results from the ambient noise analyzing (predicting) unit 142 to increase the gain of an input audio signal S.

Also, similarly, in a case where ambient noise level is great across the entire band, the signal processing unit 143 controls the dynamic range control unit 431 based on the analysis results from the ambient noise analyzing (predicting) unit 142 to increase the amount of compressor.

The term "compressor" mentioned here means to increase the average reproduction level of an input audio signal. Specifically, "compressor" means to control the gain according to a signal level so as to increase the gain up to a predetermined level regarding a signal of which the signal level is a low frequency band, and so as to decrease the gain to a predetermined level regarding a signal of which the signal level is a high frequency band.

Note that, in FIG. 3, the term "expander" means the processing of the opposite of "compressor". That is to say, with regard to an audio signal of which the dynamic range is compressed by "compressor", processing for returning to the original dynamic range is "expander". Thus, the dynamic range control unit 431 can control the dynamic range of an audio signal to be reproduced through processing such as "compressor" or "expander".

Also, for example, in a case where noise around 100 Hz is frequently included as ambient noise, the signal processing unit 143 controls the variable gain control unit 433 based on the analysis results from the ambient noise analyzing (predicting) unit 142 to boost (amplify) a signal around 100 Hz of the input audio signal S.

Also, for example, in a case where the noise component of a certain band is very great, the signal processing unit 143 cuts the signal level of the band thereof of the input audio signal S, and boosts (amplifies) the signals of the others.

The reason why the signal level of a band of which the noise component is very great is cut is because there is a noise component, and accordingly, the audio signal of the band thereof is not recognized by the user's hearing due to masking effects. Accordingly, the signal level may be unchanged without cutting the signal level.

Thus, the gain, dynamic range, or frequency property is controlled, whereby an audio signal to be reproduced can be subjected to suitable signal processing according to the ambient noise. Thus, an audio signal subjected to signal processing can be reproduced such that the listener can comfortably listen to reproduced audio. In other words, audio can be reproduced in a manner preventing influence of generated ambient noise from being received.

Method 1 for Determining Signal Processing to be Performed

Also, as described above, suitable signal processing is performed according to a situation of ambient noise, whereby signal processing to be performed can be determined from the features of ambient noise as described below.

Specifically, from the analysis results of the ambient noise analyzing (predicting) unit 142, e.g., from the frequency property of ambient noise, the generated ambient noise can be determined by being classified into several types of ambient noise features prepared beforehand. Subsequently, the parameters of signal processing to be subjected as to the input audio signal S are set for each feature of ambient noise beforehand.

Thus, from the analysis results of the ambient noise analyzing (predicting) unit 142 the features of ambient noise are determined, and the parameters of signal processing correlated with the features of the determined ambient noise are employed, whereby signal processing as to the input audio signal S can be performed.

In this case, a table which correlates the features of ambient noise with the parameters of signal processing is created in memory within the DSP 14 beforehand. Subsequently, the ambient noise analyzing (predicting) unit 142 references, for example, the table thereof provided within the DSP 14 for example, based on the analysis results of the ambient noise analyzing (predicting) unit 142 to read out the corresponding parameter, and supplies this to the signal processing unit 143.

Also, an arrangement may be made wherein the signal processing unit 143 which received the supply of the analysis results from the ambient noise analyzing (predicting) unit 142 references the table provided within the DSP 14 to read out the corresponding parameter based on the analysis results thereof, and employs this to perform signal processing.

Note that the parameter of signal processing correlated for each feature of ambient noise may be adjusted finely based on the analysis results of the ambient noise analyzing (predicting) unit 142, e.g., based on the level of ambient noise, or the like.

FIG. 4 is a diagram for describing a configuration example of a table for correlating the features of ambient noise and signal processing parameters. As shown in FIG. 4, the features of ambient noise include "ambient noise level is great", "noise in the vicinity of a particular frequency is greatly included in ambient noise", "the noise component of a particular frequency band is very great", and so forth.

A parameter of "1. Increase the gain of an input audio signal", and a parameter of "2. Increase the amount of compressor as to an input audio signal" are set to a feature that "ambient noise level is great". Subsequently, the user can select one of these two parameters.

Also, a parameter to "boost a signal in the vicinity of the particular frequency of an input audio signal" is set to a parameter of "noise in the vicinity of a particular frequency is greatly included in ambient noise".

Also, a parameter to "cut the signal of the frequency band of an input audio signal, and boost the signal of another frequency band" is set to a parameter that "the noise component of a particular frequency band is very great".

Thus, the features of ambient noise can be classified beforehand so as to correspond to the ambient noise wherein the input audio signal S has to be subjected to signal processing. Accordingly, the content of the parameter of signal processing corresponding to each ambient noise feature can also be determined beforehand.

Figure 5:
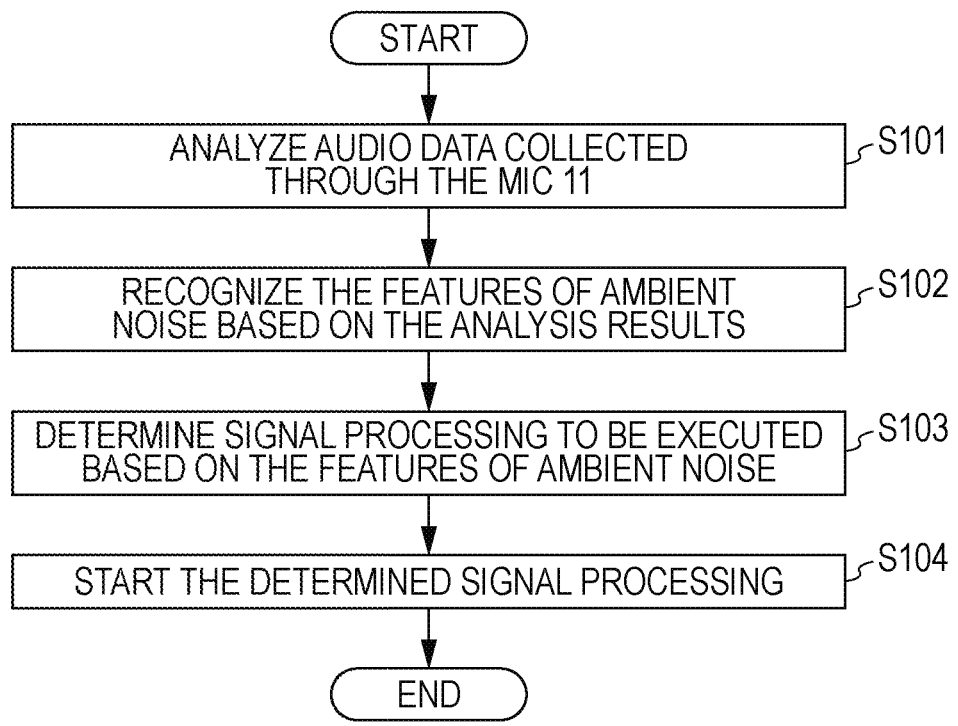
FIG. 5 is a flowchart for describing processes performed in an ambient noise analyzing (predicting) unit and signal processing unit of a DSP.

Collaboration Processing Between the Ambient Noise Analyzing (Predicting) Unit and Signal Processing Unit Next, description will be made regarding processing performed between the ambient noise analyzing (predicting) unit 142 and signal processing unit 143 with the noise canceling system 1 according to the first embodiment shown in FIG. 1. FIG. 5 is a flowchart for describing processing performed at ambient noise analyzing (predicting) unit 142 and signal processing unit 143 of the DSP 14. The processing shown in FIG. 5 is performed, for example, at timing specified by the user. Of course, the timing is not restricted to this, and an arrangement may be made wherein in a case where power is supplied to the noise canceling system 1 according to the first embodiment, the processing shown in FIG. 5 is performed repeatedly, or is performed automatically at each appropriate timing.

First, the ambient noise analyzing (predicting) unit 142 performs processing for analyzing the audio signal from the ADC 13 (ambient noise signal) (step S101). In the case of this example, the ambient noise analyzing (predicting) unit 142 informs the signal processing unit 143 of the analysis results.

The signal processing unit 143 recognizes the features of ambient noise based on the analysis results from the ambient noise analyzing (predicting) unit 142 (step S102). Subsequently, the signal processing unit 143 determines signal processing to be executed from the recognized features of ambient noise (step S103).

Specifically, the table described with reference to FIG. 4 is prepared in predetermined memory beforehand, so the signal processing unit 143 references the table of the memory based on the features of ambient noise determined in step S102 to obtain the parameter of signal processing to be executed.

Subsequently, the signal processing unit 143 starts processing for subjecting the input audio signal S to the signal processing determined in step S103 (step S104), and ends the processing in FIG. 5. Hereafter, the signal processing started in step S104 is performed continuously.

Subsequently, the user executes the processing shown in FIG. 5 again in a case where when a place where the user listens to reproduced audio is changed by the user moving, ambient noise is also changed, and the user become curious about ambient noise. Thus, an audio signal to be reproduced is subjected to appropriate signal processing according to the ambient noise of a new listening place, whereby the user can listen to reproduced audio comfortably.

Note that, with the example described with reference to FIGS. 4 and 5, description has been made regarding the case where the parameter of signal processing is determined according to the features of the ambient noise. However, the case is not restricted to this. The parameter of signal processing may be determined while taking the level of ambient noise, or the property of the noise cancel filter 141 employed simultaneously into consideration in addition to the features of ambient noise.

Method 2 for Determining Signal Processing to be Performed

Also, as described above, suitable signal processing is performed according to a situation of ambient noise, whereby signal processing to be performed can be determined from a noise category to which ambient noise belongs as described below.

Specifically, from the analysis results of the ambient noise analyzing (predicting) unit 142, e.g., from the frequency property of ambient noise, the generated ambient noise can be determined by being classified into several types of noise categories prepared beforehand. Subsequently, the parameters of signal processing to be subjected as to the input audio signal S are set for each classified noise category beforehand.

Thus, from the analysis results of the ambient noise analyzing (predicting) unit 142 the noise category is determined, and the parameter of signal processing correlated with the determined noise category is employed, whereby signal processing as to the input audio signal S can be performed.

In this case, the noise category and the parameter of signal processing are stored, for example, in the memory of the DSP 14 as a table. Subsequently, the ambient noise analyzing (predicting) unit 142 references, for example, the table thereof provided within the DSP 14 based on the analysis results of itself, to read out the corresponding parameter, and supplies this to the signal processing unit 143.

Also, an arrangement may be made wherein the signal processing unit 143 which received the supply of the analysis results from the ambient noise analyzing (predicting) unit 142 references the table provided within the DSP 14, for example, to read out the corresponding parameter based on the analysis results thereof, and employs this to perform signal processing.

Note that the parameter of signal processing correlated for each noise category may be adjusted finely based on the analysis results of the ambient noise analyzing (predicting) unit 142, e.g., based on the level of ambient noise, or the like.

FIG. 6 is a diagram for describing a configuration example of a table for correlating the noise category and signal processing parameter (signal processing content determining table). Here, the parameter of signal processing to be employed can be determined while taking the level of ambient noise (noise level) and the property of a noise cancel filter (property of a NC filter) into consideration, in addition to a noise category.

As shown in FIG. 6, the noise categories include "inside of an airplane (noise concentrates on low frequencies)", "inside of a train (noise concentrates on middle frequencies)", "crowd, etc. (noise increases across wideband)", "inside of an office (noise of a particular band occurs discretely", "indoors", and so forth. Thus, in the case of this example, noise categories are classified depending on whether to receive influence of ambient noise in what kind of situation now based on the features of generated ambient noise.

As shown in FIG. 6, classification is also performed regarding whether the level of generated noise is a low level (small), middle level (medium), or high level (large) at each noise category. Of course, noise levels may be classified finely with numeric value ranges, but in order to simplify explanation, noise levels are classified into three levels of small, medium, and large as described above. Further, in the case of this example, as shown in FIG. 6, information indicating the property of the employed noise cancel filter (NC filter) is also correlated for each noise level at each noise category.

Accordingly, in the case of this example, the parameters of signal processing are determined based on three parameters of a noise category, noise level, and the property of a noise cancel filter (NC filter). Specifically, as shown in FIG. 6, the parameter of signal processing (the content of the signal processing) is determined in accordance with the table.

For example, in a case where the noise category is "inside of an airplane (noise concentrates on low frequencies)", the noise level is "small (low level)", and the property of NC filter is "1", a signal processing parameter of "increase the signal gain of a noise band (low frequencies), and apply weak compressor thereto" is determined.

Similarly, in a case where the noise category is "inside of an airplane (noise concentrates on low frequencies)", the noise level is "medium (middle level)", and the property of NC filter is "2", a signal processing parameter of "increase the signal gain of a noise band (low frequencies), and apply middle compressor thereto" is determined.

Also, in a case where the noise category is "inside of an airplane (noise concentrates on low frequencies)", the noise level is "large (high level)", and the property of NC filter is "3", a signal processing parameter of "cut a noise band (low frequencies), increase the gain of high frequencies, and apply strong compressor thereto" is determined.

Also, in a case where the noise category is "inside of a train (noise concentrates on middle frequencies)", the noise level is "small (low level)", and the property of NC filter is "4", a signal processing parameter of "increase the signal gain of a noise band (middle frequencies)" is determined.

Also, in a case where the noise category is "inside of a train (noise concentrates on middle frequencies)", the noise level is "medium (middle level)", and the property of NC filter is "5", a signal processing parameter of "increase the signal gain of a noise band (middle frequencies), and apply weak compressor thereto" is determined.

Also, in a case where the noise category is "inside of a train (noise concentrates on middle frequencies)", the noise level is "large (high level)", and the property of NC filter is "6", a signal processing parameter of "apply middle compressor thereto, and emphasize beat" is determined. Note that, in the case of emphasizing beat, for example, processing, such that the time constant of the dynamic range control unit 431 of the signal processing circuit 143 is controlled, is performed.

Figure 7:
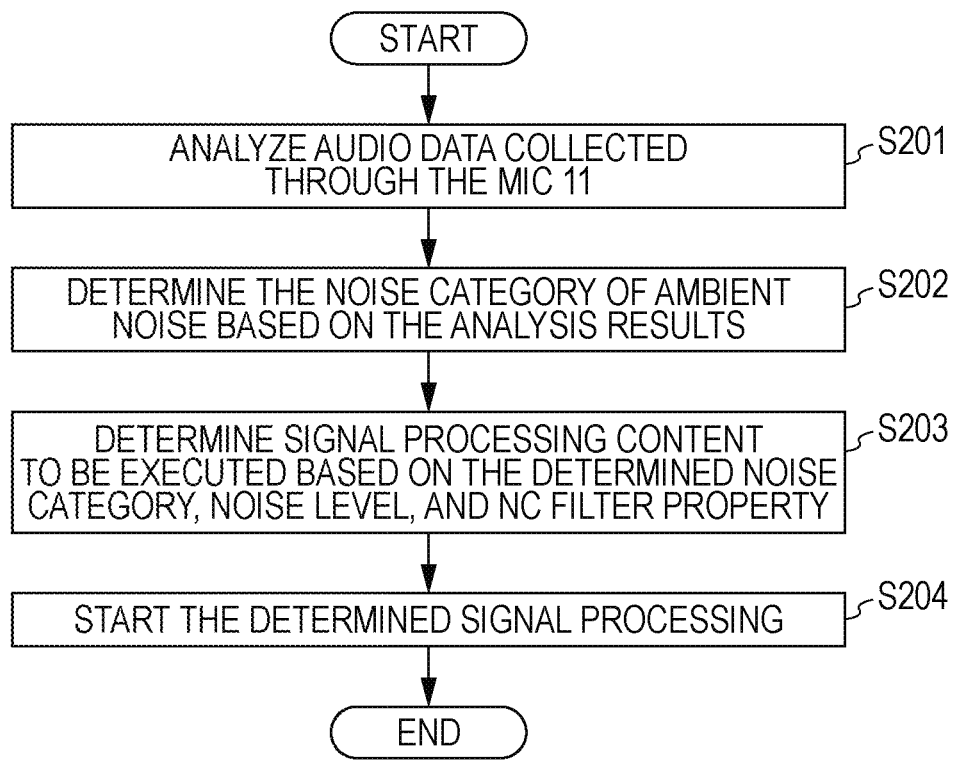
FIG. 7 is a flowchart for describing processes performed in the ambient noise analyzing (predicting) unit and signal processing unit of the DSP.

Collaboration Processing Between the Ambient Noise Analyzing (Predicting) Unit and Signal Processing Unit Next, description will be made regarding processing performed between the ambient noise analyzing (predicting) unit 142 and signal processing unit 143 in a case where the content of the signal processing at the signal processing unit 143 is determined by employing the table shown in FIG. 6 with the noise canceling system 1 according to the first embodiment shown in FIG. 1. FIG. 7 is a flowchart for describing processing performed at ambient noise analyzing (predicting) unit 142 and signal processing unit 143 of the DSP 14.

The processing shown in FIG. 7 is performed, for example, at timing specified by the user. Of course, the timing is not restricted to this, and an arrangement may be made wherein in a case where power is supplied to the noise canceling system 1 according to the first embodiment, the processing shown in FIG. 7 is performed repeatedly, or is performed automatically at appropriate timing.

First, the ambient noise analyzing (predicting) unit 142 performs processing for analyzing the audio signal from the ADC 13 (ambient noise signal) (step S201). Subsequently, in the case of this example, the ambient noise analyzing (predicting) unit 142 informs the signal processing unit 143 of the analysis results.

The signal processing unit 143 determines the noise category of ambient noise based on the analysis results from the ambient noise analyzing (predicting) unit 142 (step S202). Subsequently, the signal processing unit 143 references the signal processing content determining table shown in FIG. 6 to determine the content of the signal processing to be executed based on the determined noise category, the noise level obtained as the analysis results, and the property of the noise cancel filter at the present moment (step S203).

Subsequently, the signal processing unit 143 starts processing for subjecting the input audio signal S to the signal processing content determined in step S203 (step S204), and ends the processing in FIG. 7. Hereafter, the signal processing started in step S204 is performed continuously.

Subsequently, the user executes the processing shown in FIG. 7 again in a case where when a place where the user listens to reproduced audio is changed by the user moving, ambient noise is also changed, and the user become curious about ambient noise. Thus, an audio signal to be reproduced is subjected to appropriate signal processing according to the ambient noise of a new listening place, whereby the user can listen to reproduced audio comfortably.

Note that, in the case of the signal processing content determining table shown in FIG. 6, the parameter of signal processing to be performed (the content of the signal processing) has been determined from the three items of the noise category, noise level, and the property of the NC filter, but the present invention is not restricted to this.

Briefly, only the noise category may be employed, and in this case, the noise category is determined, whereby the content of the signal processing to be performed at the signal processing unit 143 can be determined. Also, in addition to the noise category, one of the noise level and property of the noise cancel, filter may also be employed. Also, an arrangement may be made wherein another parameter other than the noise level, and the property of the noise cancel filter 141, e.g., the amount of reproduced sound, or the like is taken into consideration, thereby determining the content of the signal processing.

Thus, in the case of the noise canceling system 1 according to the first embodiment, an audio signal to be reproduced is subjected to suitable signal processing according to ambient noise. Thus, audio obtained by reproducing the audio signal thereof can be reproduced so as to prevent influence of ambient noise from being received. Thus, the listener can listen to reproduced sound comfortably even under a situation wherein ambient noise occurs.

Note that, with the first embodiment, the signal processing at the signal processing unit 143 according to ambient noise, and the noise cancel processing employing the noise cancel filter 141 and adding unit 144 have been performed simultaneously. However, the present invention is not restricted to this. It goes without saying that only the signal processing at the signal processing unit 143 according to ambient noise may be performed.

Also, the tables shown in FIGS. 4 and 6 are examples, the features of ambient noise and noise categories may be classified into more details, and also various types of parameter of signal processing may be employed. Also, FIG. 6 illustrates the case where the different property of the NC filter is employed according to the noise category and noise level, but the present invention is not restricted to this. Various types of NC filter are employed according to various situations, or the same NC filter is employed even if the noise categories and noise levels differ in some cases.

Second Embodiment

Configuration of Noise Canceling System 2

Figure 8:
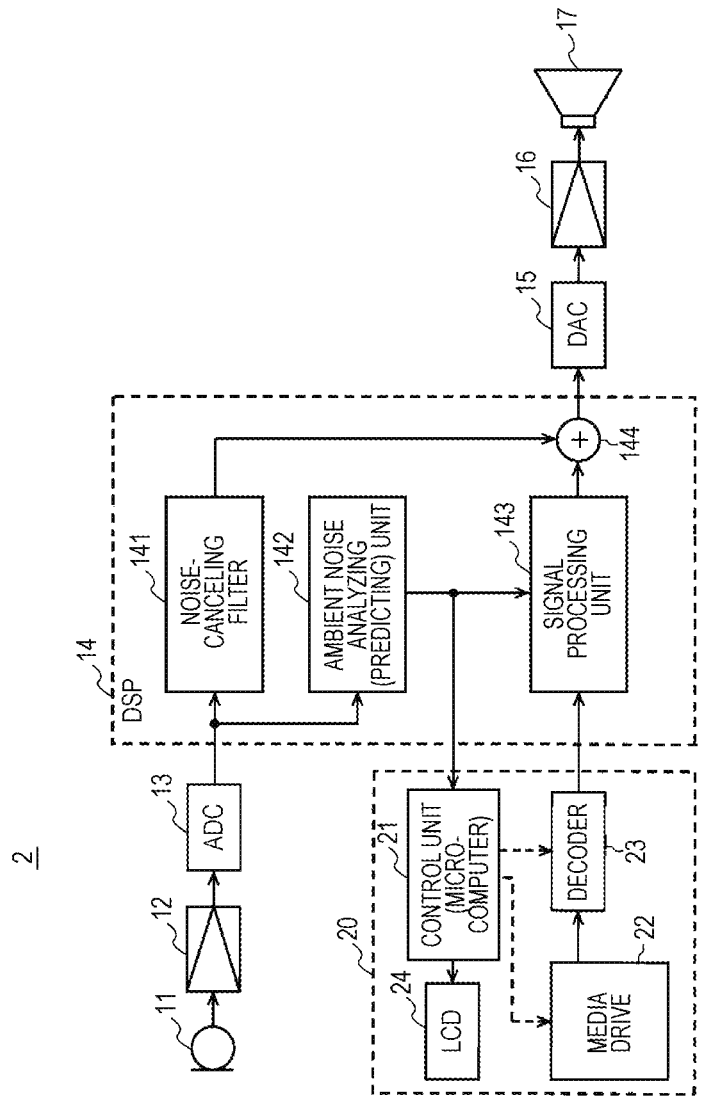
FIG. 8 is a block diagram for describing a noise canceling system to which an embodiment of the present invention has been applied.

FIG. 8 is a block diagram for describing a noise canceling system 2 according to a second embodiment. The noise canceling system 2 according to the second embodiment has the same configuration as the noise canceling system 1 shown in FIG. 1 except that the configuration includes a playing unit 20. Accordingly, with the noise canceling system 2 shown in FIG. 8, the components configured in the same way as the noise canceling system 1 according to the first embodiment shown in FIG. 1 are denoted with the same reference numerals, and detailed description thereof will be omitted.

As shown in FIG. 8, the playing unit 20 of the noise canceling system 2 includes a control unit 21, media drive 22, decoder 23, and LCD (Liquid Crystal Display) 24.

The control unit 21 controls each unit of the playing unit 20, which is a microcomputer configured of, though not shown in the drawing, nonvolatile memory, such as a CPU (Central Processing Unit), ROM (Read Only Memory), RAM (Random Access Memory), EEPROM (Electrically Erasable and Programmable ROM), and so forth, being connected through a CPU bus.

The media drive 22 includes a predetermined recording medium, and a recording medium drive for reading out data from the recording medium, or recording data in the recording medium. Note that various types of recording medium may be employed as the recording medium, such as semiconductor memory, hard disk, optical disc such as DVD (Digital Versatile Disc) or the like, a small magneto-optical disk called MD (Mini Disc), or the like. Note that MD and Mini Disc are registered trademarks.

With the second embodiment, the recording medium employed for the media drive 22 is, for example, semiconductor memory. Though details will be described later, with the recording medium of the media drive 22, the audio signals (audio data) of various types of musical pieces are compressed in accordance with a predetermined data compression method, and are stored and held.

The decoder 23 subjects the audio signal subjected to data compression, read out from the recording medium of the media drive 22, to decompression processing (decompression processing) to restore an audio signal before data compression, and supplies the decompressed audio signal to the signal processing unit 143.

Under control of the control unit 21, the LCD 24 can perform display indicating an operation status, and can display the title of an audio signal to be reproduced, and additionally, various types of guidance message or warning message or the like.

With the noise canceling system 2 according to the second embodiment, the analysis results at the ambient noise analyzing (predicting) unit 142 are also supplied to the control unit 21 of the playing unit 20.

Subsequently, the control unit 21 of the playing unit 20 controls the media drive 22 to selectively read out, from the recording medium, optimal audio signals which the user can listen to comfortably even under an environment where ambient noise occurs at the present moment based on the analysis results from the ambient noise analyzing (predicting) unit 142.

This read audio signal is decompressed at the decoder 23, and is then supplied to the signal processing unit 143 of the DSP 14. Subsequently, in the same way as with the above-mentioned first embodiment, the audio signal from the decoder 23 is subjected to signal processing according to ambient noise at the signal processing unit 143.

Subsequently, the audio signal subjected to the signal processing is supplied to the adding unit 144, where the noise cancel signal from the noise cancel filter 141 is added thereto to decrease ambient noise.

Subsequently, the audio signal to be reproduced is supplied to the speaker 17 through the DAC 15, and speaker amplifier 16, where the audio signal selected at the control unit 21 is reproduced and emitted.

Description will be made specifically regarding processing performed principally by the control unit 21 of the playing unit 20. The control unit 21 of the playing unit 20 determines an extraction condition of an audio signal to be reproduced based on the analysis results from the ambient noise analyzing (predicting) unit 142. This extraction condition can be determined by setting to the noise category determined based on the analysis results from the ambient noise analyzing (predicting) unit 142 beforehand.

FIG. 9 is a diagram for describing an example of the selection condition table for selecting an audio signal to be reproduced. The table shown in FIG. 9 is created, stored, and held at nonvolatile memory within the control unit 21, or the recording medium of the media drive 22 beforehand. The selection condition table shown in FIG. 9 is for correlating the noise category determined according to the analysis results from the ambient noise analyzing (predicting) unit 142 with the selection condition of an audio signal to be reproduced, as described above.

The noise categories are generally the same as those in the case of the signal processing content determining table according to the first embodiment described with reference to FIG. 6. Specifically, the noise categories include "inside of an airplane (noise concentrates on low frequencies)", "inside of a train (noise concentrates on middle frequencies)", "crowd, etc. (noise increases across wideband)", "indoors (little noise across the entire band)", and so forth.

Also, the selection conditions of an audio signal are made up of a genre to which the audio signal (music data) belongs, tempo, tonality, mean level, beat, and so forth. The genre mentioned here indicates a type to which an audio signal belongs, such as pop, rock, classical, and so forth.

The tempo means the speed of music to be reproduced from an audio signal, e.g., is represented in terms of the number of beats per minute (BPM). Also, the tonality indicates whether a major or minor key.

Also, the mean level is the mean value of the loudness of the entire tune, and is represented with units such as decibel (dB) or the like. The beat indicates whether the basic rhythm is expressed strongly or softly.

In the case of the selection condition table shown in FIG. 9, the extraction conditions in the case of the noise category being "inside of an airplane (noise concentrates on low frequencies)" are that the genre is "pop", tempo is "quick", tonality is "major key", and beat is "strong". Accordingly, in this case, a pop tune with quick tempo and cheerful strong beat is selected.

Also, the extraction conditions in the case of the noise category being "inside of a train (noise concentrates on middle frequencies)" are that the genre is "pop", tempo is "slow", tonality is "minor key", and beat is "soft". Accordingly, in this case, a pop tune with slow tempo and melancholy soft beat is selected.

Also, the extraction conditions in the case of the noise category being "crowd, etc. (noise increases across wideband)" are that the genre is "rock", mean level is "high", and beat is "strong". Accordingly, in this case, a rock tune with a high mean level and strong beat is selected.

Also, the extraction conditions in the case of the noise category being "indoors (little noise across the entire band)" are that the genre is "classical", and there is none of other particular conditions. Accordingly, in this case, a classical piece is selected.

Thus, basically, the selection conditions are determined so as to select an audio signal wherein reproduced audio is not canceled out by generated ambient noise. Note that, in a case where there is a possibility that a person may exist nearby, like inside of a train, appropriate adjustment can be performed such that a tune having a low mean level is selected.

In a case where the selection conditions regarding an audio signal to be reproduced are determined based on the selection condition table shown in FIG. 9, an audio signal recorded in the recording medium has to be able to be selected in accordance with the determined selection conditions.

Figure 10:
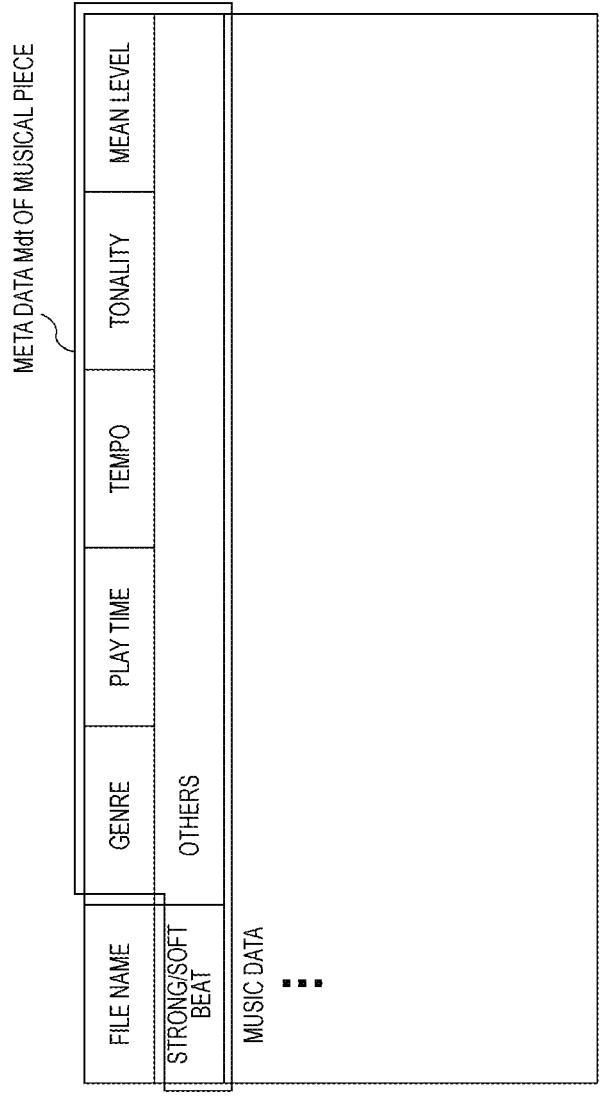
FIG. 10 is a diagram for describing an example of a file layout of an audio signal.

With the second embodiment, the audio signal stored and held in the recording medium of the media drive 22 is added with metadata beforehand. FIG. 10 is a diagram for describing an example of the file layout of the audio signal recorded in the recording medium of the media drive 22. As shown in FIG. 10, an audio signal (music data) is recorded in the recording medium of the media drive 22 as a file. Subsequently, a file name is appended to the file of each audio signal, and also information such as a genre, play time, tempo, tonality, mean level, strength/softness of beat (strong/soft beat), and so forth is appended thereto as metadata Mdt.

Thus, the control unit 21 of the playing unit 20 of the noise canceling system 2 according to the second embodiment determines the noise category based on the analysis results from the ambient noise analyzing (predicting) unit 142. Subsequently, the control unit 21 references the selection condition table shown in FIG. 9 stored in the nonvolatile memory of the control unit 21 for example, based on the determined noise category to determine the selection conditions of an audio signal to be reproduced.

Subsequently, the control unit 21 controls the media drive 22 to read out audio data having metadata matching with the determined selection conditions. Thus, the audio signal having metadata matching with the selection conditions determined at the control unit 21 is read out from the media drive 22 and supplied to the decoder 23, and is played.

Note that, in a case where the metadata to be appended to the audio signal is provided by the provider side of the audio signal (music data) adding the metadata to the audio signal beforehand, this can be employed. Also, in a case where no metadata is appended to the audio signal, an analysis program is employed to analyze the audio signal, thereby obtaining the metadata, and this metadata can be employed.

Note that, as a technique for analyzing an audio signal an invention has been disclosed in Japanese Unexamined Patent Application Publication No. 2005-274708 for example, wherein an audio signal is analyzed, thereby detecting the metadata such as tempo and so forth. Subsequently, the beat of the audio signal can be determined based on the detected tempo, and also the mean level can be determined based on the level of the audio signal, or the like.

Thus, in a case where no metadata is appended to an audio signal to be reproduced, the audio signal is analyzed, thereby determining tempo, beat, mean level, and further tonality, and these can be appended as metadata. Also, the user can set the genre, for example, through an unshown key operating unit.

Summary of the Processing of Playing Unit 20

Figure 11:
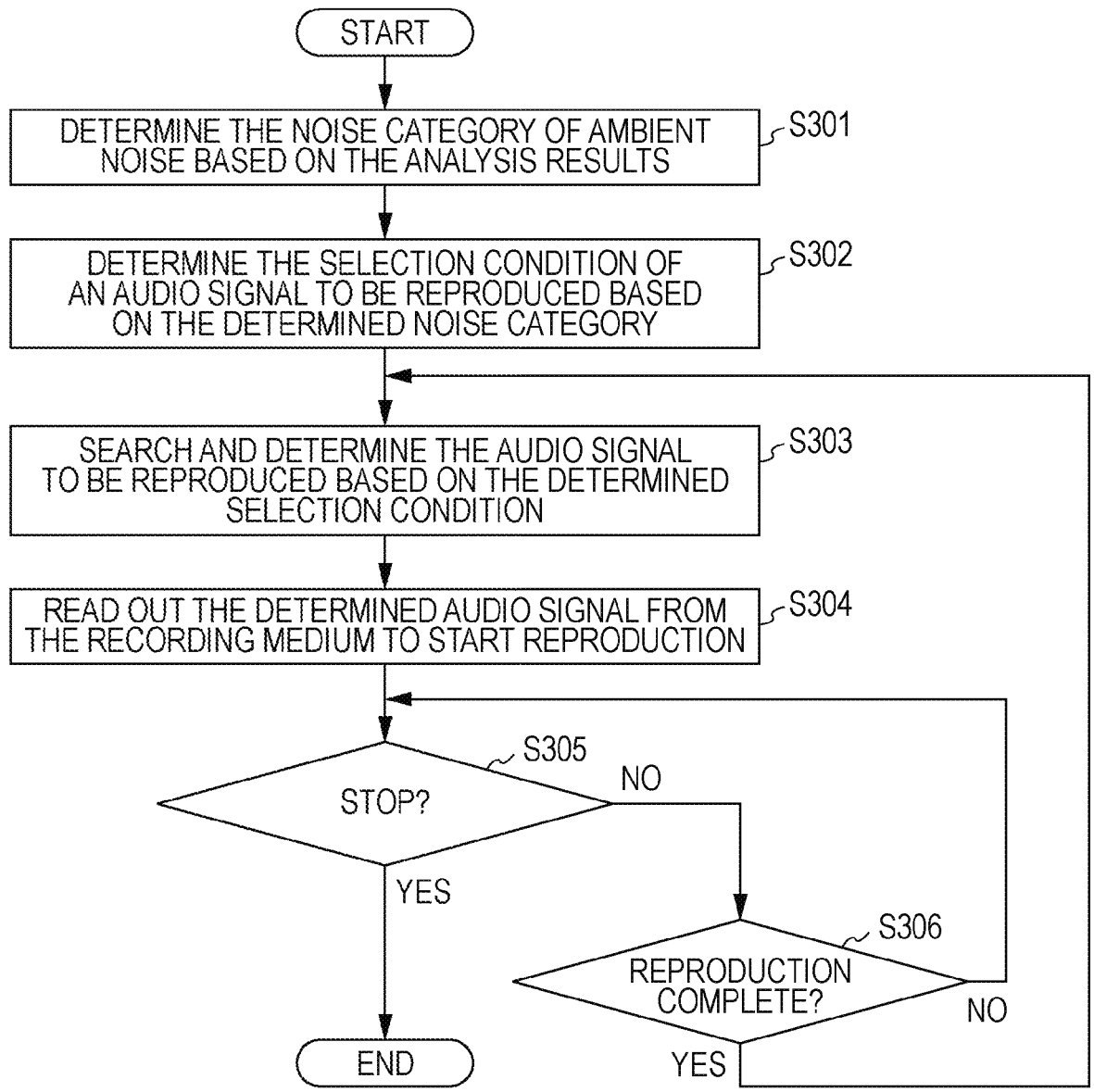
FIG. 11 is a flowchart for describing the operation of a playing unit 20.

Next, description will be made regarding the operation of the playing unit 20 with the noise canceling system 2 according to the second embodiment. FIG. 11 is a flowchart for describing the operation of the playing unit 20. The processing shown in FIG. 11 is performed principally by the control unit 21 of the playing unit 20 at a timing of accepting instruction input for performing reproduction of an audio signal from the user, for example, through an unshown key operating unit connected to the control unit 21 of the playing unit 20. In this case, the other portions such as the DSP 14 and so forth start operation at a timing of accepting a play instruction.

Subsequently, the control unit 21 accepts the analysis results from the ambient noise analyzing (predicting) unit 142 to determine the noise category of ambient noise (step S301). Subsequently, the control unit 21 references the selection condition table (FIG. 9) stored and held in the self nonvolatile memory based on the determined noise category to determine the selection condition of an audio signal (music data) to be reproduced (step S302).

Next, the control unit 21 controls the media drive 22 to search and determine an audio signal having metadata matching with the selection condition determined in step S302 (step S303). Subsequently, the control unit 21 controls the media drive 22 and decoder 23 to perform processing for reading out and playing the audio signal determined in step S303 from the recording medium (step S304).

Subsequently, the control unit 21 determines whether or not instruction input for instructing to stop playing of an audio signal has been received from the user (step S305). With the determination processing in step S305, when determining that a stop instruction has not been received, determination is made whether or not the playing of the audio signal being reproduced has been completed (whether or not one tune worth of playing has been completed) (step S306).

With the determination processing in step S306, when determining that the playing of the audio signal being reproduced has not been completed, the control unit 21 repeats the processing from step S305. Also, with the determination processing in step S306, when determining that the playing of the audio signal being reproduced has been completed, the control unit 21 repeats the processing from step S303 to perform the playing of the audio signal of a new musical piece.

Also, with the determination processing in step S305, when determining that a stop instruction has been received, the processing shown in FIG. 11 is ended. Thus, an audio signal which prevents influence of ambient noise from being received can be selected and reproduced according to generated ambient noise. Accordingly, the listener can listen to reproduced sound comfortably even under a situation wherein ambient noise occurs.

Note that, with the second embodiment, in the same way as with the noise canceling system 1 according to the first embodiment, the signal processing at the signal processing unit 143, and the noise cancel processing employing the noise cancel filer 141 and adding unit 144 are performed simultaneously, but the present invention is not restricted to this.

At least the selection processing alone of an audio signal to be reproduced according to ambient noise can be performed, which is allowed principally by the control unit 21 of the playing unit 20.

In addition to the selection processing of an audio signal to be reproduced according to ambient noise, at least one of the signal processing at the signal processing unit 143, and the noise cancel processing employing the noise cancel filer 141 and adding unit 144 can be performed.

Also, with the second embodiment, description has been made assuming that the selection condition table shown in FIG. 9 is employed, but the present invention is not restricted to this. For example, as described with reference to FIG. 4, a table may be employed, which sets the selection conditions regarding an audio signal in a manner correlated with the features of ambient noise.

Also, simply, just the genre may be taken as the selection condition such that in a case where an ambient noise level is equal to or greater than a predetermined value, an audio signal of which the genre is rock is selected, and in a case where an ambient noise level is smaller than a predetermined value, an audio signal of which the genre is classical, is selected.

Advantages

In the case of the above-mentioned embodiments, according to various noise environments, an audio signal to be reproduced is subjected to signal processing adapted to the environment thereof, or an audio signal to be reproduced is selected, whereby an optimal audio signal can be reproduced as to the user (listener). Thus, an optimal audio appreciative environment can be provided to the user.

Implementability as a Method Invention

Note that, with the above-mentioned first and second embodiments, the processing performed at each unit of the noise cancel filter 141, ambient noise analyzing (predicting) unit 142, signal processing unit 143, and adding unit 144 which are realized by the DSP 14, and the processing performed at each unit of the control unit 21 and media drive 22 of the playing unit 20 are equivalent to the processing of each process corresponding to the method according to the present invention. Accordingly, the method according to the present invention can also be realized.

Implementability as a Program Invention

Also, with the above-mentioned first and second embodiments, the processing performed at each unit of the noise cancel filter 141, ambient noise analyzing (predicting) unit 142, signal processing unit 143, and adding unit 144, realized by the DSP 14, can be realized by a program executed at the DSP 14. Similarly, the processing performed at each unit of the control unit 21 and media drive 22 of the playing unit 20 can be realized by a program executed at the control unit 21.

Also, in a case where a microcomputer which combines the function of the DSP 14, and the function of the control unit 21 of the playing unit 20 is provided, the processing realized at each unit of the above-mentioned units can be performed by a program executed at the microcomputer thereof.

Other Embodiments

Note that, with the above-mentioned embodiments, the audio signal from the microphone for noise collection has been input to the ambient noise analyzing (predicting) unit 142, but the present invention is not restricted to this. For example, only the noise component processed at the noise cancel filter 141 may be input to the ambient noise analyzing (predicting) unit 142. In this case, the reduction amount by frequency at the noise cancel filter may be employed for analysis of ambient noise after an input signal is subtracted on the frequency axis beforehand.

Also, an arrangement may be made wherein, with the ambient noise analyzing (predicting) unit 142, the signal input thereto is subjected to processing such as FFT (Fast Fourier Transform) or the like, thereby converting this into a signal on the frequency axis, following which this signal is corrected with a curve for weighting networks, following which this signal is subjected to analysis of ambient noise.

Also, the present invention may be applied to, as described above, both of the feedback noise canceling system and the feed-forward noise canceling system.

In the case of the feedback noise canceling system, it has been commonly performed to subject an audio signal to equalizer corresponding to the noise cancel filter 141. With the above-mentioned embodiments, the equalizer 432 is provided in the signal processing unit 143 described with reference to FIG. 3. Thus, providing the two equalizers leads to increase in costs, so it goes without saying that various modifications may be made such that one equalizer combining both equalizers is provided.

Also, with the above-mentioned embodiments, description has been made regarding the case where the present invention has been applied to the noise canceling system employing the headphone system as an example, but the present invention is not restricted to this. Even if no noise cancel function is provided, the present invention may be applied to various audio processing devices, such as an audio player or recorder/player or the like which can realize the above-mentioned functions of the ambient noise analyzing (predicting) unit 142 and signal processing unit 143.

Of course, the present invention may be applied to the noise canceling system having the noise cancel function, whereby reproduction of comfortably listenable audio can be performed.

Also, with regard to signal processing to be performed actually, sound loudness level, equalizer processing, dynamic range processing, or the like can be performed while considering various conditions such as ambient noise, masking effects by a user's ear, performance of the processing system of an audio signal, and so forth. Accordingly, it goes without saying that there is a case where signal processing to be performed upon an audio signal performs sound loudness level, equalizer processing, and dynamic range processing in a combined manner.

The present application contains subject matter related to that disclosed in Japanese Priority Patent Application JP 2008-156190 filed in the Japan Patent Office on Jun. 16, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An audio signal processing device comprising:
a microphone configured to collect noise;
analyzing means configured to analyze a first audio signal collected by said microphone and to identify a particular frequency band in which noise is distributed and determine a level of the noise in the first audio signal within the particular frequency band;
signal processing means configured to perform signal processing, based on analysis results of said analyzing means, on a second audio signal to be reproduced, and further configured to employ at least one parameter for said signal processing that is determined based at least in part upon a classification of the noise into one of a plurality of defined categories;
noise-canceling signal forming means configured to form a noise-canceling signal from the first audio signal collected by said microphone; and
adding means configured to add the noise-canceling signal from said noise-canceling signal forming means to an output signal from said signal processing means.

2. The audio signal processing device according to claim 1, wherein said signal processing means perform one or more of
dynamic range control,
frequency property control, and
gain control.

3. The audio signal processing device according to claim 1, further comprising:
storage means configured to store one or more audio signals to be reproduced to which metadata, including genre, tempo, tonality, mean level, and beat, is added;
selecting means configured to select, based on the analysis results from said analyzing means and said metadata of the second audio signal, a third audio signal stored in said storage means; and
playing processing means configured to read out the third audio signal selected by said selecting means from said storage means to form the second audio signal to be supplied to said signal processing means.

4. The audio signal processing device according to claim 1, wherein said signal processing means performs signal processing, based at least in part on a property of said noise-canceling signal forming means, on said second audio signal to be reproduced.

5. The audio signal processing device according to claim 1, wherein the plurality of defined categories comprises categories corresponding to types of features the noise might contain.

6. The audio signal processing device according to claim 1, wherein the plurality of defined categories comprises types of noise categories to which the noise might belong.

7. An audio signal processing device comprising:
a microphone configured to collect noise;
analyzing means configured to analyze a first audio signal collected by said microphone to detect a level and a frequency property of the first audio signal, wherein the level and the frequency property indicate a frequency distribution of the noise;
storage means configured to store at least one audio signal to be reproduced, to which metadata, including genre, tempo, tonality, mean level, and beat, is added;
selecting means configured to select, based on analysis results from said analyzing means and said metadata of the at least one audio signal, a third audio signal stored in said storage; and
playing processing means configured to read out the third audio signal selected by said selecting means from said storage means to form a second audio signal for reproduction.

8. The audio signal processing device according to claim 5, further comprising:
noise-canceling signal forming means configured to form a noise-canceling signal from the first audio signal collected by said microphone; and
adding means configured to add the noise-canceling signal from said noise cancel signal forming means to an output signal from said playing processing means.

9. The audio signal processing device according to claim 7, further comprising:
signal processing means configured to perform signal processing, based on analysis results of said analyzing means, on said second audio signal to be reproduced.

10. The audio signal processing device according to claim 7, wherein the storage means is configured to store a file comprising music data of the at least one audio signal, and the metadata is added to the at least one audio signal by appending the metadata to the file.

11. An audio signal processing method comprising:
analyzing a first audio signal collected through a noise-collecting microphone to identify a particular frequency band in which noise is distributed and determine a level of the noise in the first audio signal within the particular frequency band;
classifying the noise into one of a plurality of defined categories;
signal processing, based on analysis results of said analyzing and employing at least one parameter for said processing that is determined based upon the one of the plurality of defined categories in which the noise is classified, a second audio signal to be reproduced;
forming a noise-canceling signal from the audio signal collected by said noise-collecting microphone; and
adding said formed noise-canceling signal to an output audio signal of said signal processing.

12. The audio signal processing method according to claim 11, wherein, in said signal processing, one or more of
dynamic range control,
frequency property control, and
gain control,
are performed.

13. The audio signal processing method according to claim 11, further comprising:
selecting, based on said analysis results of the analyzing and said metadata of the selected audio signal, a third audio signal stored in storage means; and
reading out of the third audio signal from said storage means to form the second audio signal for reproduction;
wherein one or more audio signals to be reproduced have been stored in said storage means, and to which the metadata, including genre, tempo, tonality, mean level, and beat, is added.

14. The method of claim 11, wherein, in said signal processing, said second audio signal to be reproduced is subjected to signal processing while taking said forming into consideration.

15. The method of claim 11, wherein the plurality of defined categories comprises categories corresponding to types of features the noise might contain.

16. The method of claim 11, wherein the plurality of defined categories comprises types of noise categories to which the noise might belong.

17. An audio signal processing method comprising:
   analyzing a first audio signal collected through a noise-collecting microphone to detect a level and a frequency property of the first audio signal, wherein the level and the frequency property indicate a frequency distribution of the noise;
   selecting, based on analysis results in said analyzing and metadata of one or more audio signals to be reproduced, a third audio signal stored in a predetermined recording medium and to which the metadata, including genre, tempo, tonality, mean level, and beat, is added; and
   reading out the third audio signal from said recording medium to form a second audio signal for reproduction.

18. The audio signal processing method according to claim 17, further comprising:
   forming a noise-canceling signal from the first audio signal collected by said noise-collecting microphone; and
   adding the formed noise-canceling signal to the second audio signal.

19. The audio signal processing method of claim 17, wherein adding the metadata to the third audio signal stored in the predetermined recording medium comprises appending the metadata to a file stored in the predetermined recording medium, the file comprising music data of the third audio signal.

20. An audio signal processing device comprising:
   a microphone configured to collect noise;
   an ambient noise analyzer configured to analyze a first audio signal collected by said microphone to identify a particular frequency band in which noise is distributed and determine a level of the noise in the first audio signal within the particular frequency band;
   a signal processor configured to perform signal processing, based on analysis results of said analyzing unit, on a second audio signal to be reproduced, and further configured to employ at least one parameter for said signal processing that is determined based at least in part upon a classification of the ambient noise into one of a plurality of defined categories;
   a noise-canceling signal forming unit configured to form a noise-canceling signal from the first audio signal collected by said microphone; and
   an adding unit configured to add the noise-canceling signal from said noise-canceling signal forming unit to an output signal from said signal processor.

21. The audio signal processing device according to claim 20, wherein said signal processor performs signal processing, based at least in part on a property of said noise-canceling signal forming unit, on said second audio signal to be reproduced.

22. The audio signal processing device according to claim 20, wherein the plurality of defined categories comprises categories corresponding to types of features the noise might contain.

23. The audio signal processing device according to claim 20, wherein the plurality of defined categories comprises types of noise categories to which the noise might belong.

24. An audio signal processing device comprising:
   a microphone configured to collect noise;
   an analyzing unit configured to analyze a first audio signal collected by said microphone to detect a level and a frequency property of the first audio signal, wherein the level and the frequency property indicate a frequency distribution of the noise;
   a storage unit configured to store at least one audio signal to be reproduced and to which metadata, including genre, tempo, tonality, mean level, and beat, is added;
   a selecting unit configured to select a third audio signal stored in said storage unit, based on analysis results from said analyzing unit and said metadata of the at least one audio signal stored in the storage unit; and
   a playing processing unit configured to read out the third audio signal selected by said selecting unit from said storage unit to form a second audio signal for reproduction.

25. The audio signal processing device of claim 24, wherein the storage unit is configured to store a file comprising music data of the at least one audio signal, and the metadata is added to the at least one audio signal by appending the metadata to the file.

26. An audio signal processing device, comprising:
   a microphone configured to collect noise;
   analyzing means configured to analyze a first audio signal collected by said microphone and to identify a particular frequency band in which noise is distributed and determine a level of the noise in the first audio signal within the particular frequency band;
   signal processing means configured to perform signal processing, based on analysis results of said analyzing means, on a second audio signal to be reproduced;
   noise-canceling signal forming means configured to form a noise-canceling signal from the first audio signal collected by said microphone; and
   adding means configured to add the noise-canceling signal from said noise-canceling signal forming means to an output signal from said signal processing means;
   wherein said signal processing means performs signal processing, based at least in part on a property of said noise-canceling signal forming means, on said second audio signal to be reproduced, and is further configured to select, based on analysis results of said analyzing means, one of a plurality of noise categories that corresponds to the frequency distribution of the noise.

* * * * *